(12) United States Patent
Baumgartner et al.

(10) Patent No.: US 7,934,180 B2
(45) Date of Patent: Apr. 26, 2011

(54) INCREMENTAL SPECULATIVE MERGING

(75) Inventors: Jason Baumgartner, Austin, TX (US);
Robert Kanzelman, Rochester, MN (US); Hari Mony, Austin, TX (US);
Viresh Paruthi, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 12/127,051

(22) Filed: May 27, 2008

(65) Prior Publication Data

US 2009/0300559 A1 Dec. 3, 2009

(51) Int. Cl.
*G06F 17/50* (2006.01)
(52) U.S. Cl. ........................................ 716/100
(58) Field of Classification Search ............... 716/1, 2, 716/3, 100
See application file for complete search history.

(56) References Cited

U.S. PATENT DOCUMENTS

| | | | |
|---|---|---|---|
| 6,086,626 A | 7/2000 | Jain et al. | |
| 6,205,520 B1 * | 3/2001 | Palanca et al. | 711/138 |
| 7,120,883 B1 | 10/2006 | Van Antwerpen et al. | |
| 7,181,601 B2 * | 2/2007 | Rudd et al. | 712/239 |
| 2002/0010899 A1 * | 1/2002 | Wallace | 716/2 |
| 2005/0125645 A1 * | 6/2005 | Rudd et al. | 712/239 |
| 2005/0289210 A1 | 12/2005 | Langsdorf | |
| 2006/0190873 A1 * | 8/2006 | Baumgartner et al. | 716/5 |
| 2006/0277508 A1 | 12/2006 | Baumgartner et al. | |
| 2009/0083488 A1 * | 3/2009 | Madriles Gimeno et al. | 711/118 |
| 2009/0100385 A1 * | 4/2009 | Baumgartner et al. | 716/2 |

FOREIGN PATENT DOCUMENTS

| | | |
|---|---|---|
| EP | 0413831 B1 | 6/1999 |
| JP | 0527678 A2 | 10/1993 |

* cited by examiner

*Primary Examiner* — Jack Chiang
*Assistant Examiner* — Suchin Parihar
(74) *Attorney, Agent, or Firm* — Brevetto Law Group

(57) ABSTRACT

An incremental speculative merge structure which enables the elimination of invalid merge candidates without requiring the discarding of the speculative merge structure and all verification results obtained upon that structure. Targets are provided for validating the equivalence of gates $g1i$ and $g2i$, and the fanout references of $g1i$ and $g2i$ are provided to a controllable multiplexer set to output $g1i$. Upon determining non-equivalence of $g2i$, of failing to proved equivalence, the multiplexer is switched to output the $g1i$ fanout reference, thus undoing the incremental speculative merge.

19 Claims, 6 Drawing Sheets

(a) Original Netlist (b) Netlist after traditional
speculative merge of g2i onto g1i (a) Original Netlist (b) Netlist after incremental
speculative merge of g2i onto g1i (a) Original Netlist (b) Netlist after incremental speculative merge of g3i onto either g1i or g2i

500

INCREMENTAL SPECULATIVE MERGING

BACKGROUND

1. Field

The present invention relates to modeling and testing digital designs of state machines, and more specifically, to systems, methods and computer products for the identification of dependent state variables to aid in logic design and verification.

2. Description of Related Art

A system such as an electrical circuit including state holding elements may be modeled using state equations and state variables that describe the behavior and state of the system. A complete set of state variables for a system, coupled with logic that defines the transitions between states, typically contains enough information about the system's history to enable computation of the system's future behavior. Simplifying the model to reduce the number of state variables, or simplifying the logic that defines state transitions, lessens the computational cost of analyzing the model, for example, to verify that it conforms to a given specification.

The synthesis and verification of state variable models often requires a great deal of computational resources. Numerous conventional frameworks for synthesis and verification of modets rely upon the paradigm of merging equivalent (or opposite-functionality) gates to enhance some optimality criteria. In synthesis, merging equivalent gates generally implies a smaller, lower power circuit. In verification, merging equivalent gates often has a variety of benefits such as speeding up falsification and proof algorithms.

Most high performance frameworks for deriving gates which may be merged use an assume-then-prove framework to speculatively reduce the size of the collective merging proof obligation by substitution of fanout references to merge candidates. While useful to simplify the proof obligation, one weakness is that if any of the merge candidates are determined to be invalid (e.g., they may functionally differ), the entire verification problem must be cast anew by "refinement"—that is, by forming a new speculatively-merged problem that discards the invalid merge candidates, and iterating this process until all merge candidates are be proven to be equivalent. This restart cost of discarding all verification results upon a refinement tends to be very expensive.

What is needed is a more efficient way of state variable model synthesis and verification.

SUMMARY

The various embodiments disclosed herein address the above stated needs by providing systems, methods and computer products that model a speculative merge in a particular way, hereafter referred to as an "incremental speculative merge", which enables said incremental speculative merge to be undone in response to determining nonequivalence. Various embodiments also enable the reuse of verification results across refinements, a novel approach that can save a dramatic amount of resources for verification.

Various embodiments involve methods, systems and computer products for incremental speculative merging executed on a computer which eliminate invalid merges. Gates, including at least a first gate and a second gate, are derived as candidates for a merge. Each of said first and said second gates includes at least one fanout reference. The fanout reference of the first gate and the fanout reference of the second gate are configured as inputs into a switchable unit such as a multiplexer having an output configured to be controllable by a selector control. During the equivalence testing the selector control is set output the first gate's fanout reference. Upon determining the gates to be nonequivalent or in response to any alternate criteria upon which the merge from said first gate onto said second gate is determined to be invalid, the selector control is manipulated to switch the output the second gate's fanout reference, thus undoing the speculative merge.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1:
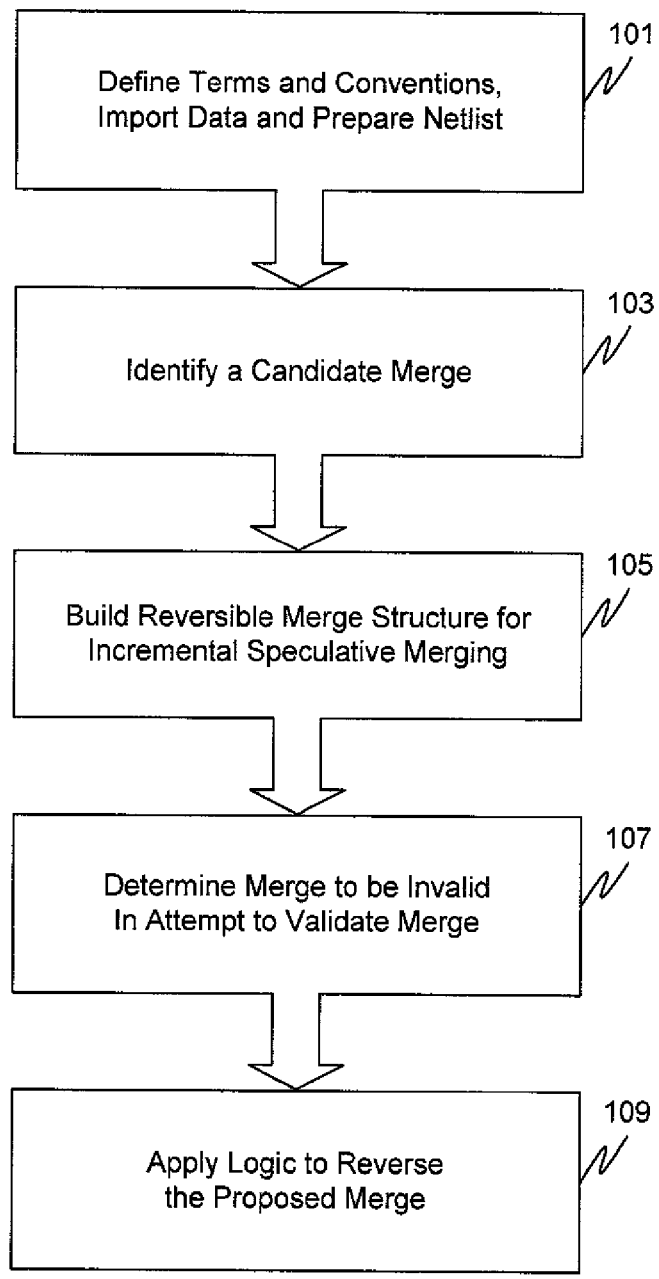
FIG. 1 depicts an overview of an exemplary method for incremental speculative merging.

FIG. 1 depicts an overview of an exemplary method for incremental speculative merging. The method of FIG. 1 begins in 101 to define the conventions and terms, and set the initial conditions of the system model. This typically entails importing data and preparing a netlist for the system design. An exemplary netlist contains a directed graph with vertices representing gates, and edges representing interconnections between those gates. The gates have associated functions, such as constants, primary inputs (which may be referred to as RANDOM gates), combinational logic such as AND gates, and sequential state holding elements. A sequential state holding element has one or more inputs and at least one output, each of which may be characterized by discrete states (e.g., logical 1 or logical 0). The various embodiments can be practiced with any sort of state machine including state holding elements (e.g., registers, latches, RAM circuitry, or the like). The state of the output (or the state of each output, if more than one) is determined by the previous states of the input channels. The initialization time or reset time of a register is referred to herein as time zero (t=0). Registers typically have two associated components, their next-state functions and their initial-value functions. Both of these associated components may be represented as other gates in the graph. Semantically, for a given register the value appearing at its initial-value gate at time logical 0 will be applied as the value of the register itself (time "0"="Initialization" or "reset" time). The value appearing at its next-state function gate at time "i" will be applied to the register itself at time "i+1". Certain gates of the model may be labeled as targets. Targets correlate to the properties sought to be verified. One goal of the verification process is to find a way to drive a "1"

to a target node, and generate a "trace" illustrating (or reporting) this scenario if one is found. Another goal of verification is to prove that no such assertion of the target is possible, that is, there is no way to drive a "1" to the target node.

Upon completing 101 the method proceeds to 103 to identify a candidate merge. This may be done by evaluating various regions of circuitry, considering redundancy, estimating potential reductions gains, or other like methods for identifying a candidate merge. Once the candidate merge has been identified in 103 the method proceeds to 103 to build a reversible merge structure, hereafter referred to as an "incremental speculative merge" structure, for carrying out the speculative merging. The process of building and operating an incremental merge structure is described throughout this disclosure, for example, in conjunction with FIGS. 2-5, and in particular, blocks 207-209 and 407-411. Examples of circuitry from such structures can be seen in FIG. 3D and FIG. 5. Once 103 has been completed and the reversible merge structure for incremental speculative merging is in place the method proceeds to 105. In block 105 the candidate merge gates are evaluated to determine whether the proposed merge is valid or invalid. In the event the merge is determined to be invalid the method proceeds to 107 to undo, or reverse, the effects of the merge. Aspects of various embodiments are further described in conjunction with the FIGS. 2-6 of this disclosure.

Figure 2:
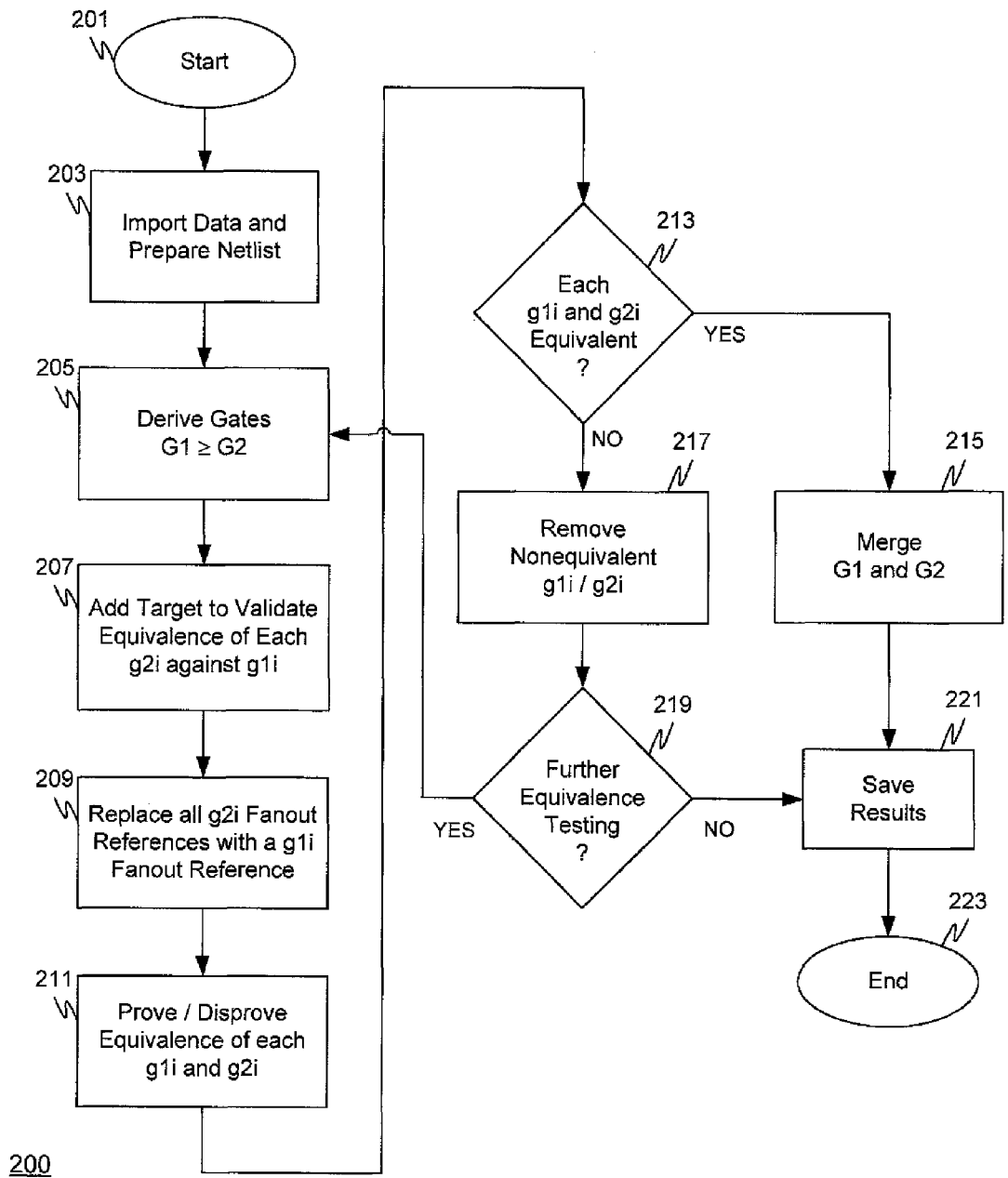
FIG. 2 depicts a flowchart 200 of an exemplary method of determining equivalence using an assume-then-prove framework.
Figure 3A:
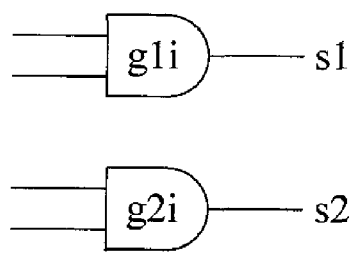
FIGS. 3A-D depict exemplary logic for implementing various assume-then-prove frameworks.
Figure 3B:
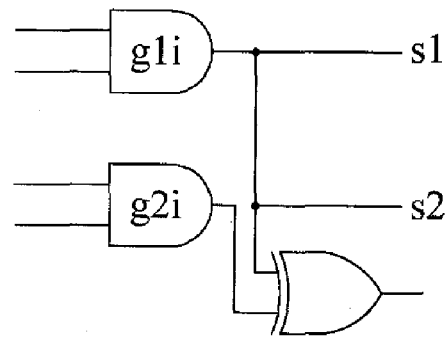

FIG. 2 depicts a flowchart 200 of an exemplary method of determining equivalence using an assume-then-prove framework. An example of logic for implementing this sort of assume-then-prove framework is depicted in FIGS. 3A-B. Various embodiments of the present invention provide an incremental speculative merge structure which enables the elimination of invalid merge candidates without requiring the discarding of the speculative merge structure and all verification results obtained upon that structure. In addition to this, various embodiments have additionally built upon this incremental speculative merge structure an optimal incremental assume-then-prove framework that enables maximal reuse of verification results obtained upon the pre-refinement netlist. Finally, methods are disclosed to use the incremental speculative merge structure even in a property checking framework that does not attempt to prove any suspected equivalences. Instead, in some embodiments it allows one to leverage the merges when trying to assert other arbitrary verification goals, and discern (or correct) any merges that may trigger invalid assertions.

The method of FIG. 2 begins at 201 and proceeds to 203 where the netlist format is defined. A netlist contains a directed graph with vertices representing gates, and edges representing interconnections between those gates. The gates typically have associated functions such as constants, primary inputs (hereafter referred to as RANDOM gates), combinational logic such as AND gates, and sequential elements (hereafter referred to as registers). In some cases, it may be desirable to exhaustively analyze the behavior of the design for a bounded number of time-frames. This may be done by "unfolding" the design for N time-frames. Unfolding refers to converting a sequential problem into a combinational problem by unfolding it in time, for example, new RANDOM gates are introduced for each time step, and a copy of the netlist for time-step "i" feeds the next-state functions of the state-holding elements in time-step "i+1". This unfolded netlist is then subjected to a satisfiability (SAT) check to see if the CHECKSTOP can be asserted within the N unfolded time-steps. Further information about unfolding and SAT checking is provided in a patent issued to the same inventors as this disclosure, U.S. Pat. No. 7,360,185, which is hereby incorporated by reference herein in its entirety.

Given the netlist imported in 203 some approaches for merging gates rely upon an assume-then-prove framework for optimality. This approach is described in a U.S. patent issued to the same inventors as this disclosure, U.S. Pat. No. 7,260,799, which is hereby incorporated by reference herein in its entirety. Assuming G1 and G2 represent sets of gates (e.g., including g1$i$ and g2$i$), such an assume-then-prove frameworks can operate as described herein. Upon importing the netlist in 203 the method proceeds to 205. In block 205 the system derives a set of gates G1→G2 to potentially merge, if it can be proven that doing so is correct. The notation "G1→G2" means that we wish to merge G1 onto G2, thereby replacing fanout connections to G1 by fanout connections to G2. This is depicted in FIG. 3B, where gate g2$i$ is merged onto g1$i$, which would be denoted as g2$i$→g1$i$. The gates G1 and G2 which are to be speculatively merged may be called candidate gates. The method then proceeds to 207 to begin speculatively merging G1→G2 by first adding a "target" which validates that each g1$i$ in G1 and each g2$i$ in G2 which we would like to merge truly evaluate to the same value. This can be seen in FIG. 3A as the output s2 from g2$i$, as compared to s1 from g1$i$. If targets s2=s1 for every input applied to both g1$i$ and g2$i$ then the gates G1 and G2 are equivalent. The logic used to indicate that all outputs s2=s1 can be seen in FIG. 3B as an exclusive-OR gate that outputs a "0" each time s2=s1. Upon completing 207 the method proceeds to 209 to replace all fanout references to g2$i$ by a reference to g1$i$. This is shown in FIG. 3B as the output s2 being tied to s1.

Once the framework for proving equivalence is set up the method proceeds to 211 to attempt to prove each of the targets introduced above, s2 and s1, as being correct. In 213 it is determined whether the outputs s2 and s1 are the same for each input. If the system succeeds in proving every g1$i$ equivalent to every corresponding g2$i$, then G1 and G2 are deemed to be equivalent and can safety be merged. If this is the case and the equivalence of g1$i$ and g2$i$ is proven, the method proceeds from 213 along the "YES" path to 215. In block 215 the equivalent gates G1 and G2 are merged, having been determined to be equivalent. The method then proceeds to 221 to save the results of the merging, and then to 223 where the method ends. Returning to block 213, if any of the g1$i$ and g2$i$ cannot be proven equivalent (e.g., if they are demonstrated to be inequivalent or they cannot be proven or disproven as equivalent due to resource limitations, uncertainties, or other like reasons), then they are removed from the gates G1 and G2 to be merged so G1 and G2 can again be tested for equivalence (or so the method can end). Hence, if for one or more inputs it turns out that s2≠s1 then the equivalence of g1$i$ and g2$i$ is disproven and the method proceeds from 213 along the "NO" path to 217. In block 217 conventional assume-then-prove frameworks remove the non-equivalent g2$i$ (or g1$i$) component before proceeding to 219. In 219 it is determined whether or not to re-peat the equivalence testing with other hypothesized gates. If further equivalence testing is to be performed the method proceeds from 219 along the "YES" branch back to 205 to derived gates hypothesized to be equivalent. Otherwise, back in 219 the method proceeds along the "NO" branch to 221 to save the results, if any, and then to 223 where the method ends.

Figure 3C:
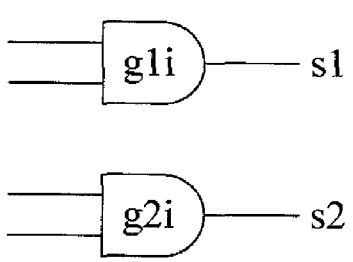
Figure 3D:
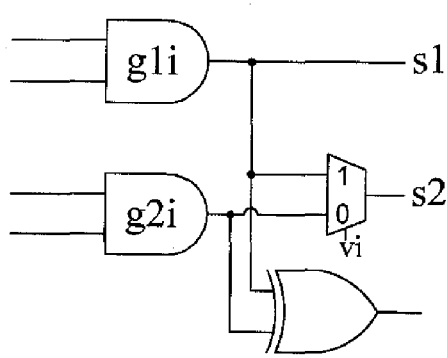

FIGS. 3A-D depict exemplary logic for implementing various assume-then-prove frameworks. FIGS. 3A-B depict aspects of logic associated with a conventional speculative merge, for example, as done in blocks 207-209 of FIG. 2. In such an assume-then-prove framework s1 is a fanout sink of g1$i$ and s2 is a fanout sink of g2$i$. The speculative merge process consists of replacing fanout references of g2$i$ by a reference to g1$i$, thus reducing the size and complexity of targets in the fanout of g2*i* that are generally expressed as equivalence checks over gates otherwise including both g1*i* and g2*i* in their fanin cone. It should be noted that reduction may be critical to enabling the completion of difficult equivalence proofs in block 211. However, the refinement step entailed by the "NO" branch from 213 is often very costly since the analysis and verification results performed upon the speculatively-reduced model of blocks 207-209 are typically discarded. The logic depicted in FIGS. 3C-D overcomes this drawback, thus enabling the reuse of verification results across refinements. The embodiments depicted in FIGS. 3C-D enable an incremental mechanism to undo the merge, if determined to be invalid, without the need to refine and discard the entire previous speculatively-merged model. FIG. 3D depicts the incremental speculative merge structure for a 1:1 merging. The primary difference between FIG. 3B and FIG. 3D is that instead of unconditionally replacing the fanout reference to g2*i* by g1*i*, it is replaced by a multiplexer (MUX) configured to select an output through use of a fresh input variable "vi", whose "vi=1" data-input correlates to the merged value g1*i*, and whose "vi=0" data-input correlates to the original value g2*i*. The incremental speculative merge process associated with the circuitry of FIG. 3D is discussed in further detail in conjunction with FIG. 4.

Figure 4:
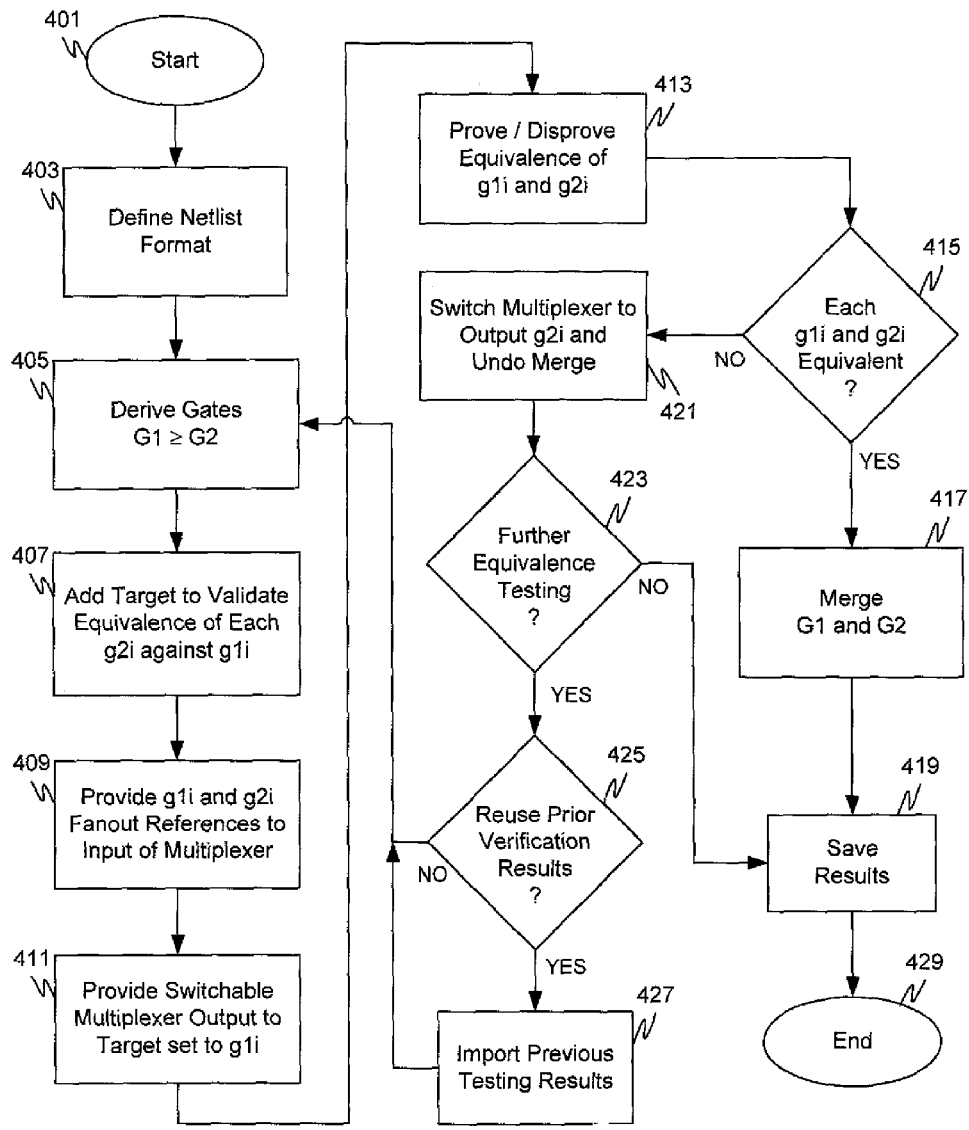
FIG. 4 depicts a flowchart 400 of an exemplary method of determining equivalence and merging gates using an assume-then-prove framework according to various embodiments of the present invention.

FIG. 4 depicts a flowchart 400 of an exemplary method of determining equivalence and merging gates using an assume-then-prove framework according to various embodiments for incremental speculative merging. An example of logic for implementing the various embodiments according to this method is depicted in FIGS. 3C-D. The method of FIG. 4 begins at 401 and proceeds to 403 where the netlist is imported, in a manner similar to the netlist disclosed above in conjunction with FIG. 2. Once the netlist is imported in 403 the method proceeds to 405 to derive a set of candidate gates G1→G2 to evaluate for possibly being merged if it can be proven that gates G1 and G2 are equivalent. In block 407 the system begins speculatively merging G1→G2 by first adding a "target" that validates each g1*i* in G1 and each g2*i* in G2 truly evaluate to the same value. The target may be a gate, an output, or other logic for evaluating the equivalence of one gate versus another. An example of structure for achieving this can be seen in FIG. 3C as the output s2 from g2*i*, as compared to s1 from g1*i*. If the target s2=s1 for every input applied to both g1*i* and g2*i* then the gates G1 and G2 are deemed to be equivalent. One way of implementing the target is by using a gate or other logic that indicates all outputs in which s2=s1. In FIG. 3D this is done with an exclusive-OR gate that outputs a "0" each time s2=s1. Alternatively, an exclusive-NOR gate could instead be used to output a "1" each time s2=s1. Other forms of logic or gates can be used to indicate the equivalence of s2 and s1. Upon completing 407 to provide a target for validating equivalency the method proceeds to 409.

Block 409 replaces the fanout references to g2*i* by a multiplexer configured to be selected by an input variable "vi" whose "vi=1" data input is driven by g1*i* and whose "vi=0" data input is driven by g2*i*. This is shown in FIG. 3D as the multiplexer with an output s2 and one input tied to output s1 from g1*i*. The other multiplexer input, the "vi=0" data input, is tied to the g2*i* output. In lieu of a multiplexer any sort of controllable switching mechanism may be used to switch between the output from g1*i* and g2*i,* including for example, dedicated circuitry, a software driven unit, a programmable logic array, other like type of controllable switching mechanism. Once the multiplexer or other switching logic is in place the method then proceeds to 411.

In block 411 the multiplexer output is provided to the fanout references of g2*i*. This is depicted in FIG. 3D as the output of the multiplexer labeled s2. The method then proceeds to 413 to attempt to prove that the s2 and s1 targets are equivalent. This may be done by comparing g1*i* and g2*i* for each of the outputs to these gates. In the configuration of FIG. 3D implemented with an exclusive-OR gate a "0" will be outputted each time s2=s1. In the event a "1" is outputted by the exclusive-OR gate the g1*i* and g2*i* will be discovered to be non-equivalent. The method proceeds to 415 where it is determined whether the outputs s2 and s1 are the same for each input. If the system succeeds in proving every g1*i* equivalent to g2*i*, then these gates are considered equivalent and may safely be merged. The method then proceeds from 415 along the "YES" path to 417, and the equivalent gates G1 and G2 are merged. Following 417 the method proceeds to 419 to save the results of the incremental speculative merging. The method then proceeds from 419 to 429 and ends.

Returning to block 415, if any corresponding values for g1*i* and g2*i* cannot be proven equivalent (e.g., if they are demonstrated to be inequivalent or they cannot be proven or disproven as equivalent due to reasons such as resource limitations), then the method proceeds from 415 along the "NO" path to 421. In block 421 the multiplexer or other switchable mechanism is manipulated to reverse the proposed merge and again feed the output from g2*i* to s2. This may be done in some embodiments by merging the selector variable "vi" to "0" which effectively undoes the proposed merges and removes those pairings determined to be non-equivalent from G1 and G2. Once the effects of the merge are undone the method proceeds from 421 to 423 to determine whether further equivalence testing is to be performed, e.g., gates G1 and/or 62 are to be derived in a different manner thought to be equivalent. If further equivalence validating is to be done the method proceeds from 423 along the "YES" branch to 425. In 425 the system determines whether any of the prior verification results can be reused.

One benefit of various embodiments is that the verification problem does not necessarily need to be constructed anew in steps 407-409 after iterating through a refinement of step 421. Instead, verification results from prior iterations may be reused across refinements. To reuse verification results the method proceeds from 425 along the "YES" path to 427. Examples of such types of "verification reuse" information include: targets that were already proven as equivalent; any algorithmic learning that has been established (e.g. SAT learned clauses); time-frames and scenarios at which targets are not assertable; and test patterns that may be of use in exposing corner-case behaviors of the design. Intuitively, such reuse is possible since the transform during a refinement may consist of replacing some MUXes created in step 409 with the original gates in the design as if no speculative merge had been done. Since the MUX may take either the original behavior or the merged behavior, merely restricting its selectable values cannot cause the MUX to take any values that it could not have taken before. Hence, "unreachability" information learned before the restriction is still valid after. Upon exploiting verification reuse in 427 the method returns back to 405 to begin another round of incremental speculative merging.

Returning to block 425, if it was determined back at this point that no verification results were to be reused the method proceeds from 425 along the "NO" branch to 405 for further equivalence verification. Returning to block 423, in the event it is determined that no further equivalence testing is to take place the method proceeds from 423 along the "NO" branch to 419 to save the results of the incremental speculative merging, if any, and then to 429 where the method of FIG. 4 ends.

Figure 5:
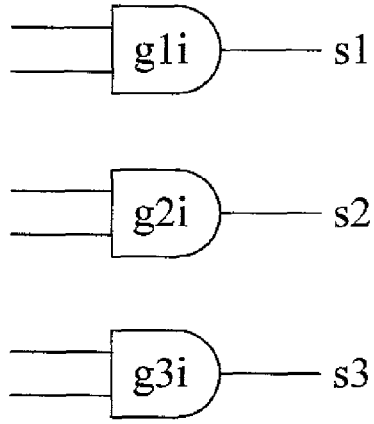
FIG. 5 depicts exemplary logic for implementing an incremental speculative merging framework for class-based speculative merging.
Figure 5:
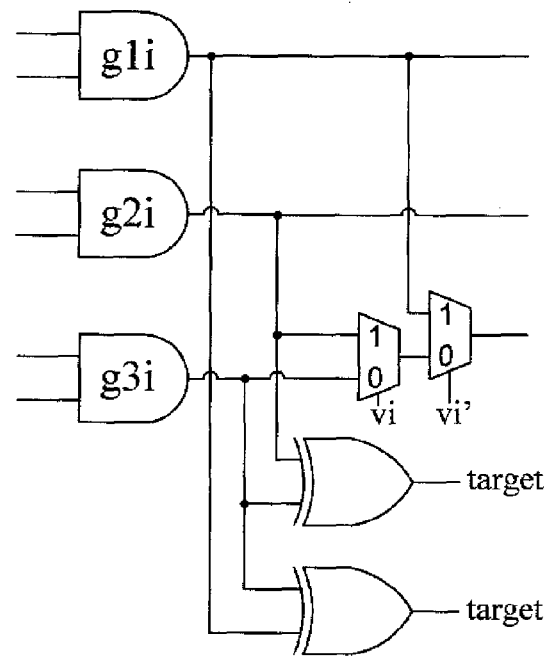

FIG. 5 depicts exemplary logic for implementing an incremental speculative merging framework for class-based speculative merging. Assume-then-prove frameworks often operate on "equivalence-classes" of gates rather than merely pairs. For example, it may be the case that three or more gates are suspected of being equivalent instead of only two. In a convention assume-then-prove framework, a "representative" of each equivalence class is chosen, and every gate in the equivalence class other than the representative is speculatively merged onto that representative, as if it were an independent 1:1 merge. However, in an incremental speculative merge framework, it is desirable to model flexibility that, after a refinement, will not merely discard the possibility of merging a given gate g3$i$ to any other gate. Instead, various embodiments disclosed herein are robust enough to adapt from seeking to merge g3$i$ onto g1$i$ to instead seeking to merge g3$i$ onto g2$i$, for example, if it is determined that a merge of g3$i$ onto g1$i$ is invalid. To handle this generality, a general equivalence-class incremental merge framework is introduced in FIG. 5, as described below.

If there are N items in the equivalence class, we may choose a representative from that class that we will not wish to merge. For the other gates, a number N−1 of 2-input MUXes are constructed, each selected by controlling a distinct input variable to select between the original gate and each other gate in the equivalence class. We additionally build N−1 targets checking equivalence of the independent MUX inputs. FIG. 5 only depicts this process for gate g3$i$, for clarity of illustration. In practice, a similar transformation would also be performed for gate g2$i$ and for gate g1$i$. The incremental assume-then-prove algorithm discussed in conjunction with FIG. 4 may be modified by building N−1 input MUXes and targets, and by noting that upon a refinement only one of the vi, vi', or vi" variables may be merged instead of all of those associated with gates g1$i$.

One further aspect of the invention concerns the use of this incremental speculative-merge construct in a framework that attempts to assert arbitrary verification properties, not necessarily for use in an assume-then-prove reduction framework. In such a scheme, various embodiments may apply post-processing upon any traces to assess whether such traces are consistent with the original design as if speculative merging had not been done. If not, that is, if the trace does not behave similarly on the original design, we disclose a technique to identify as small a set of causal speculative merges which are invalid (causing the bogus trace or report) and to enable refinement of the model accordingly. Some such embodiments for performing incremental verification of a merged design may entail: Performing incremental speculative merges for the desired merges to yield speculatively reduced design; In response to receiving a counterexample trace on said speculatively reduced design, assessing whether that counterexample trace is valid on the original design; In response to identifying that said counterexample is not valid on speculatively reduced design, to identify a minimally-sized subset of invalid merges to eliminate on speculatively reduced design; and In response to identifying said minimally-sized subset of invalid merges, to eliminate said invalid merges through constraining said incremental speculative merge constructs and repeating verification anew while retaining previous testing results.

Validating whether an obtained trace is valid on the original model can be done, for example, in either of the following two exemplary manners. First, validation may be performed by simulating the original design (without speculative merging), and using the input valuations from the trace over the speculatively-reduced model to see if the corresponding targets are still validly asserted. A second validation process involves assessing that none of the MUX select variables 'vi' need to be assigned to "1" to produce the trace of interest. In this case, only the original signal valuations are reflected by the MUXes, hence their valuations reflect the values of the original gates without speculative merging.

Generally, it is desired to obtain as small a set as possible of speculative merges which cause bogus or otherwise erroneous behavior of an obtained trace. Working with a relatively small set of speculative merges can be advantageous if, for example, a refinement is necessary to rectify the behavior of the speculatively-reduced model. Since it is desirable to "undo" as few merges as possible it is advantageous to retain as small a speculatively-reduced model as possible. Moreover, it could be the case that even though the trace does sensitize merged values through some MUXes, those valuations may not affect the overall trace behavior with respect to the targets. Hence, the trace may be valid anyway. The paragraphs below disclose an exemplary process for obtaining a minimally-sized set of causal merges which cause bogus trace behavior. This may be done by assessing a minimally-sized subset of causal invalid speculative merges in the following manner.

A trace T1 is received from an arbitrary verification framework over the speculatively-reduced design. The received trace T1 is simulated to yield T2, injecting "0" for any unassigned selector variables 'vi'. Let set S1 be the set of selector variables which are assigned to "1" at any time-frame in the received trace. Then prune S1 (to yield set S2) for any MUXes which have exclusively identical data-input values at times when their selector variables evaluate to "1" in T2. Note at the point that S2 includes a superset of the causal speculative merges responsible for the bogus (erroneous) trace behavior.

A satisfiability (SAT) check may be cast as follows: unfold the speculatively-merged design for the length of the T1, looking for the desired behavior exhibited at the targets from T1. Also, constrain the unfolding to reflect any assignments to original design inputs which are assigned in T1. Finally, constrain to "0" in T1 any selector variables that are not assigned to "1" to disable the corresponding merge. The SAT check will be satisfiable by construction, and yields trace T3.

Attempt to prune T3 using existing techniques for reducing SAT traces, yielding trace 14. From the corresponding pruned trace T4 set S3 is defined to be the set of selector variables which have been assigned to "1" at any time-frame in T3. If S3 is empty in the previous step the trace on the speculatively-merged design can be considered valid on the original design. If not, the variables in S3 correlate to a minimally-sized set of speculative-merge-enabling variables that must be merged to eliminate the bogus behavior in the merged design.

It should be noted that, while often in this assertion-gathering scheme one will pass the incremental speculatively-merged netlist to a downstream verification framework so that refinements can be done by merging versus casting the problem anew, the analysis process of obtaining a minimally-sized set of merges responsible for bogus (erroneous) design behavior can actually be done even if the trace is obtained over a design which actually merges (not speculatively merges) the candidates. For instance, one may merely merge the desired candidates without adding any MUXes to enable incremental refinement or without adding new targets, and perform verification on the resulting smaller netlist to try to obtain traces. In this case, in the process above it should be assumed that all selector variables are assigned to "1" in the trace T1, then the set may be pruned using the subsequent simulation and SAT steps to obtain a minimal set of causal bogus speculative merges.

Figure 6:
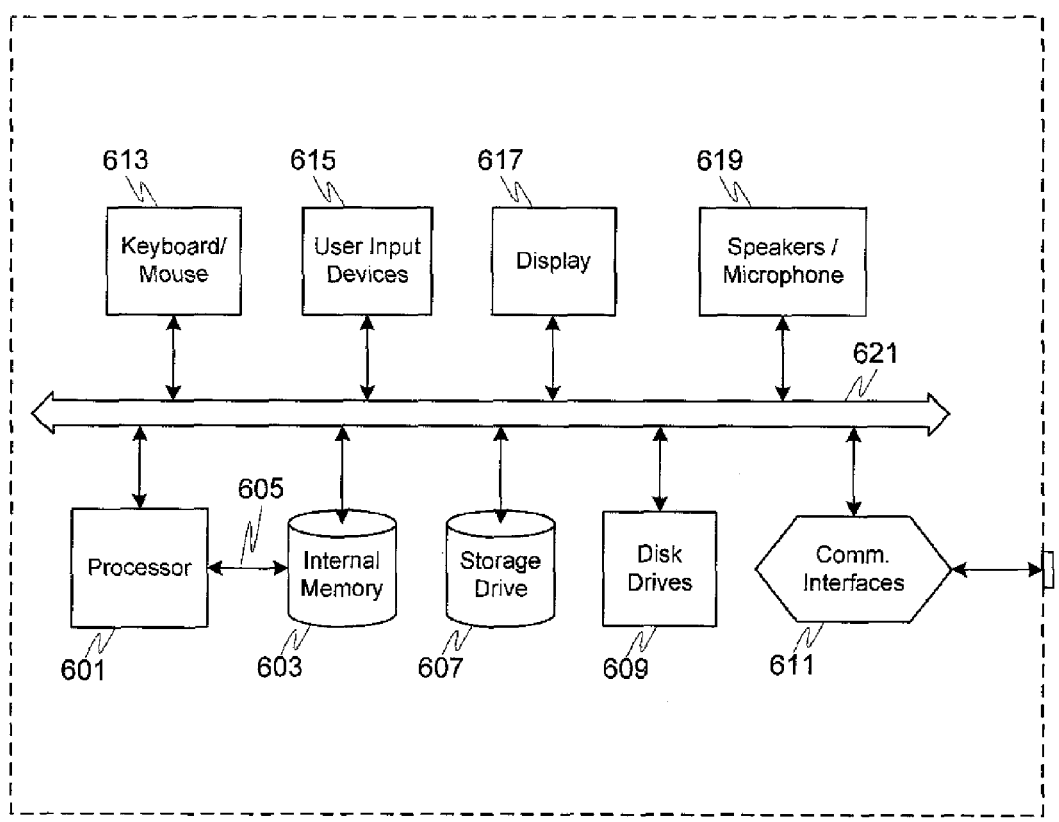
FIG. 6 depicts an exemplary computer system 600 suitable for implementing and practicing various exemplary embodiments.

FIG. 6 depicts an exemplary computer system 600 suitable for implementing and practicing various exemplary embodiments. The computer system 600 may be configured in the form of a desktop computer, a laptop computer, a mainframe computer, or any other arrangements capable of being programmed or configured to carry out instructions. The computer system 600 may be located and interconnected in one location, or may be distributed in various locations and interconnected via a local or wide area network (LAN or WAN), via the Internet, via the public switched telephone network (PSTN), or other such communication links. Other devices may also be suitable for implementing or practicing the embodiments, or a portion of the embodiments. Such devices include personal digital assistants (PDA), wireless handsets (e.g., a cellular telephone or pager), and other such consumer electronic devices preferably capable of being programmed to carry out instructions or routines.

Typically, a computer system 600 includes a processor 601 which may be embodied as a microprocessor or central processing unit (CPU). The processor 601 is typically configured to access an internal memory 603 via a bus such as the system bus 621. The internal memory 603 may include one or more of random access memory (RAM), read-only memory (ROM), cache memory, or a combination of these or other like types of circuitry configured to store information in a retrievable format. In some implementations the internal memory 603 may be configured as part of the processor 601, or alternatively, may be configured separate from it but within the same packaging. The processor 611 may be able to access internal memory 603 via a different bus or control lines (e.g., local bus 605) than is used to access the other components of computer system 600.

The computer system 600 also typically includes, or has access to, one or more storage drives 607 (or other types of storage memory) and floppy disk drives 609. Storage drives 607 and the floppy disks for floppy disk drives 609 are examples of machine readable mediums suitable for storing the final or interim results of the various embodiments. The storage drive 607 is often a hard disk drive configured for the storage and retrieval of data, computer programs or other information. The storage drive 607 need not necessary be contained within the computer system 600. For example, in some embodiments the storage drive 607 may be server storage space within a network or the Internet that is accessible to the computer system 600 for the storage and retrieval of data, computer programs or other information. For example, the computer system 600 may use storage space at a server storage farm accessible by the Internet 650 or other communications lines. The floppy disk drives 609 may include a combination of several disc drives of various formats that can read and/or write to removable storage media (e.g., CD-R, CD-RW, DVD, DVD-R, floppy disk, etc.). The computer system 600 may either include the storage drives 607 and floppy disk drives 609 as part of its architecture (e.g., within the same cabinet or enclosure and/or using the same power supply), as connected peripherals, or may access the storage drives 607 and floppy disk drives 609 over a network, or a combination of these. The storage drive 607 is often used to store the software, instructions and programs executed by the computer system 600, including for example, all or parts of the computer application program for project management task prioritization.

The computer system 600 may include communication interfaces 611 configured to be communicatively connected to the Internet, a local area network (LAN), a wide area network (WAN), or connect with other devices using protocols such as the Universal Serial Bus (USB), the High Performance Serial Bus IEEE-1394 and/or the high speed serial port (RS-232). The computers system 600 may be connected to the Internet via the wireless router 601 (or a wired router or other node—not show) rather than have a direct connected to the Internet. The components of computer system 600 may be interconnected by a bus 621 and/or may include expansion slots conforming to any of various industry standards such as PCI (Peripheral Component Interconnect), ISA (Industry Standard Architecture), or EISA (enhanced ISA).

Typically, the computer system 600 includes one or more user input/output devices such as a keyboard and/or mouse 613, or other means of controlling the cursor (e.g., touchscreen, touchpad, joystick, trackball, etc.) represented by the user input devices 615. The communication interfaces 611, keyboard and mouse 613 and user input devices 615 may be used in various combinations, or separately, as means for receiving information and other inputs to be used in carrying out various programs and calculations. A display 617 is also generally included as part of the computer system 600. The display may be any of several types of displays, including a liquid crystal display (LCD), a cathode ray tube (CRT) monitor, a thin film transistor (TFT) array, or other type of display suitable for displaying information for the user. The display 617 may include one or more light emitting diode (LED) indicator lights, or other such display devices. In addition, most computer systems 600 also include, or are connected to, one or more speakers and microphones 619 for audio output and input. Speech recognition software may be used in conjunction with the microphones 619 to receive and interpret user speech commands.

The invention may be implemented with any sort of processing units, processors and controllers capable of performing the stated functions and activities. For example, the processor 601 (or other processors used to implement the embodiments) may be a microprocessor, microcontroller, DSP, RISC processor, or any other type of processor that one of ordinary skill would recognize as being capable of performing the functions or activities described herein. A processing unit in accordance with at least one exemplary embodiment can operate computer software programs stored (embodied) on a computer-readable medium such as the internal memory 603, the storage drive 607, or other type of machine-readable medium, including for example, floppy disks, optical disks, a hard disk, CD, flash memory, ram, or other type of machine readable medium as recognized by those of ordinary skill in the art.

State holding elements, or state elements, are discussed above in terms of being implemented as registers or gates. However, in some embodiments any sort of state holding element may be used to implement various embodiments, including for example, registers, latches, state machines, or the like. For the purposes of illustrating and explaining the invention the terms variable, gate and register have been used interchangeably throughout this disclosure.

Regarding the flowcharts depicted in FIGS. 1-2 and 4, various method activities may be included or excluded as described above, or performed in a different order than shown in the figures, and still remain within the scope of at least one exemplary embodiment. For example, in some implementations of the FIG. 4 method the system may perform the decision of whether to reuse prior verification results (425) either in conjunction with or following the process of deriving gates for equivalency checking (405). It is understood that the scope of the present invention encompasses other such changes, omissions and/or additions to the flow charts and figures.

The computer software products or application programs can aid in the performance of, or perform, the various steps and activities described above. For example computer programs in accordance with at least one exemplary embodiment may include source code for deriving gates as candidates for a merge; configuring a first fanout reference of a first gate and a second fanout reference of a second gate as inputs into a multiplexer which is configured to have a selectively controllable output, manipulating the multiplexer's selector control to output the first fanout reference; and, in response to determining the merge to be invalid, applying the selector control to switch the multiplexer to output the second fanout reference; as well as source code for any other activities performed in an implementation of the various embodiments. For example, there are many further source codes that may be written to perform the stated steps and procedures above, and these are intended to lie within the scope of exemplary embodiments.

The use of the word "exemplary" in this disclosure is intended to mean that the embodiment or element so described serves as an example, instance, or illustration, and is not necessarily to be construed as preferred or advantageous over other embodiments or elements. The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A method of incremental speculative merging executed on a computer for eliminating invalid merges, the method comprising:
   derive a plurality of gates as candidates for a merge, said plurality of gates including at least a first gate with a first fanout reference and a second gate with a second fanout reference;
   configure the first fanout reference and the second fanout reference as inputs into a switchable unit having an output configured to be controllable by a selector control;
   apply said selector control to the switchable unit to output the first fanout reference; and
   in response to determining the merge between said first gate and said second gate to be invalid apply said selector control to the switchable unit to output the second fanout reference.

2. The method of claim 1, wherein the switchable unit is a multiplexer and the selector control is an addressing input of the multiplexer.

3. The method of claim 1, further comprising:
   provide a target configured to validate a merge between said first gate and said second gate.

4. The method of claim 1, further comprising:
   performing an equivalency analysis of the first gate and the second gate.

5. The method of claim 4, wherein the determining of the merge to be invalid is caused by a failure to determine equivalence between the first gate and the second gate.

6. The method of claim 4, further comprising:
   evaluating prior verification results for use in the equivalency analysis.

7. The method of claim 1, wherein the merge between said first gate and said second gate is determined to be valid, the method further comprising:
   merge said first gate and said second gate.

8. The method of claim 7, wherein said first gate and said second gate are merged to produce a speculatively reduced design, the method further comprising:
   in response to receiving a counterexample trace on said speculatively reduced design, assessing validity of the counterexample trace on original design prior to said merge.

9. The method of claim 8, further comprising:
   in response to identifying that the counterexample trace is not valid on said speculatively reduced design, identifying a minimally-sized subset of invalid merges to eliminate on speculatively reduced design; and
   in response to identifying said minimally-sized subset of invalid merges, to eliminate said invalid merges through constraining said incremental speculative merge constructs and repeating verification anew while retaining previous testing results.

10. A software product comprising a non-transitory machine readable medium including a program of instructions for incremental speculative merging to eliminate invalid merges, wherein the program of instructions upon being executed on a computer causes the computer to perform activities comprising:
    derive a plurality of gates as candidates for a merge, said plurality of gates including at least a first gate with a first fanout reference and a second gate with a second fanout reference;
    configure the first fanout reference and the second fanout reference as inputs into a switchable unit having an output configured to be controllable by a selector control;
    apply said selector control to the switchable unit to output the first fanout reference; and
    in response to determining the merge between said first gate and said second gate to be invalid apply said selector control to the switchable unit to output the second fanout reference.

11. The software product of claim 10, wherein the switchable unit is a multiplexer and the selector control is an addressing input of the multiplexer.

12. The software product of claim 10, further comprising:
    provide a target configured to validate a merge between said first gate and said second gate.

13. The software product of claim 10, further comprising:
    performing an equivalency analysis of the first gate and the second gate.

14. The software product of claim 13, wherein the determining of the merge to be invalid is caused by a failure to determine equivalence between the first gate and the second gate.

15. The software product of claim 13, further comprising:
    evaluating prior verification results for use in the equivalency analysis.

16. The software product of claim 10, wherein the merge between said first gate and said second gate is determined to be valid, the method further comprising:
    merge said first gate and said second gate.

17. The software product of claim 16, wherein said first gate and said second gate are merged to produce a speculatively reduced design, the method further comprising:

in response to receiving a counterexample trace on said speculatively reduced design, assessing validity of the counterexample trace on original design prior to said merge.

18. The software product of claim 17, further comprising:

in response to identifying that the counterexample trace is not valid on said speculatively reduced design, identifying a minimally-sized subset of invalid merges to eliminate on speculatively reduced design; and in response to identifying said minimally-sized subset of invalid merges, to eliminate said invalid merges through constraining said incremental speculative merge constructs and repeating verification anew while retaining previous testing results.

19. A computer system configured for incremental speculative merging to eliminate invalid merges, the system comprising:

input means for receiving circuit system design information to derive a plurality of gates as candidates for a merge, said plurality of gates including at least a first gate with a first fanout reference and a second gate with a second fanout reference;

a processor suitably disposed to execute instructions for configuring the first fanout reference and the second fanout reference as inputs into a switchable unit; and a selector control for switching an output of said switchable unit to the first fanout reference;

wherein said processor in response to receiving inputs determining the merge between said first gate and said second gate to be invalid controls said selector control to set the switchable unit to output the second fanout reference.

* * * * *